(12) United States Patent
Sakuma et al.

(10) Patent No.: US 6,924,231 B2
(45) Date of Patent: Aug. 2, 2005

(54) SINGLE WAFER PROCESSING METHOD AND SYSTEM FOR PROCESSING SEMICONDUCTOR

(75) Inventors: Takeshi Sakuma, Tsukui-gun (JP); Hirokatsu Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/473,449

(22) PCT Filed: Feb. 14, 2002

(86) PCT No.: PCT/JP02/01251
§ 371 (c)(1),
(2), (4) Date: Sep. 30, 2003

(87) PCT Pub. No.: WO02/082522
PCT Pub. Date: Oct. 17, 2002

(65) Prior Publication Data
US 2004/0097063 A1 May 20, 2004

(30) Foreign Application Priority Data
Mar. 30, 2001 (JP) .................................... 2001-102417

(51) Int. Cl.⁷ .............................................. H01L 21/44
(52) U.S. Cl. ...................... 438/660; 438/778; 438/478
(58) Field of Search ................................ 438/660, 778, 438/478; 392/416; 374/123–126; 427/8; 204/192.13, 192.33

(56) References Cited
U.S. PATENT DOCUMENTS
5,271,084 A * 12/1993 Vandenabeele et al. ..... 392/416

6,171,641 B1   1/2001  Okamoto et al.
6,573,185 B2 * 6/2003  Kariya ........................ 438/685

FOREIGN PATENT DOCUMENTS

| EP | 831519 | 3/1998 |
|----|--------|--------|
| JP | 1-124726 | 5/1989 |
| JP | 4-48724 | 2/1992 |
| JP | 4-206524 | 7/1992 |
| JP | 5-217930 | 8/1993 |

* cited by examiner

Primary Examiner—Dung A. Le
(74) Attorney, Agent, or Firm—Oblon, Spivak, McClelland, Maier & Neustadt, P.C.

(57) ABSTRACT

Process operations are performed for subjecting target substrates respectively to a semiconductor process, while a target substrate is placed on a worktable within a process chamber, and the worktable is heated by a temperature control member to heat the target substrate. The reflection coefficient within the process chamber is changed depending on deposition of a by-product, which is generated during the semiconductor process on the target substrate, within the process chamber. A parameter representing the reflection coefficient within the process chamber is measured, between the first and last ones of the process operations. The set temperature of the worktable used in the semiconductor process is adjusted, based on measured value of the parameter, during process operations performed after measuring the parameter. As a consequence, repeatability of the semiconductor process is improved.

16 Claims, 6 Drawing Sheets

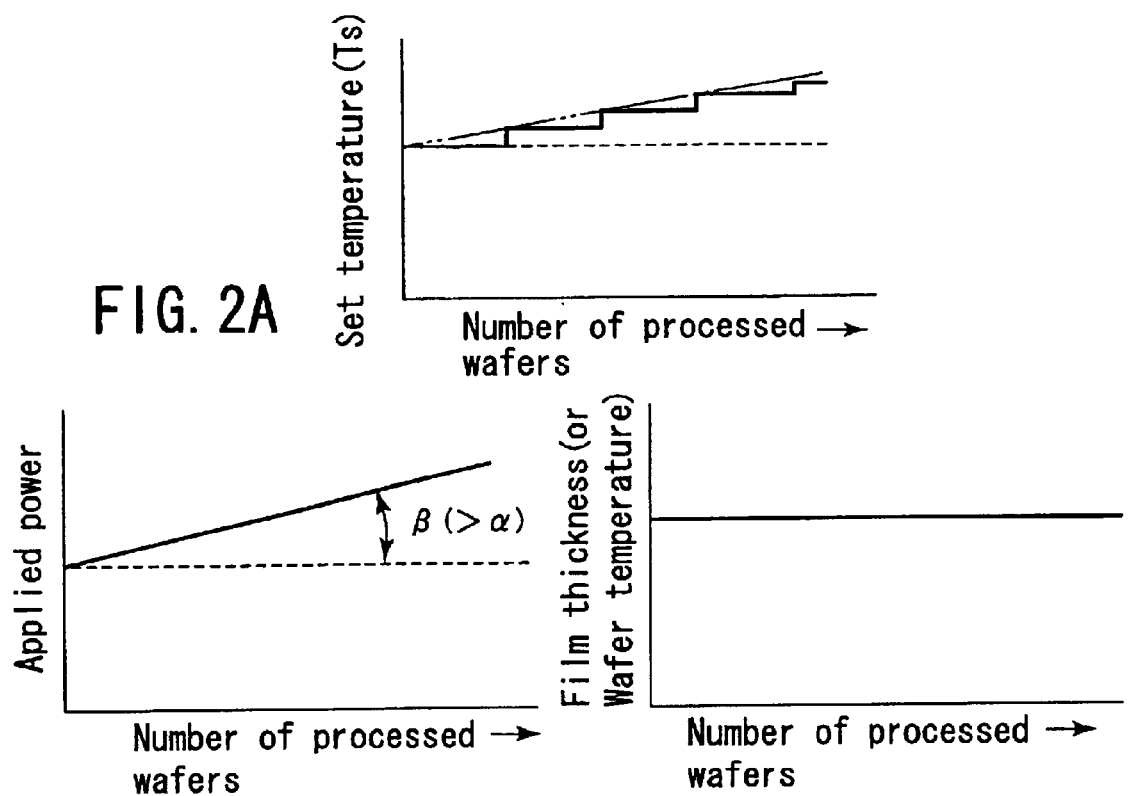
FIG. 2A
FIG. 2B
FIG. 2C
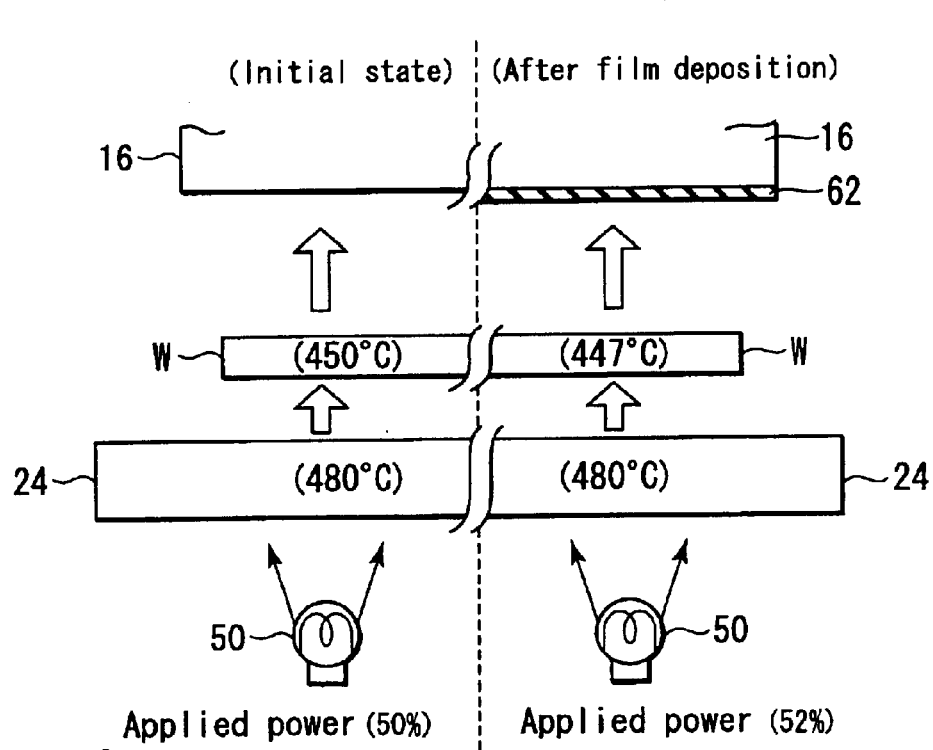
FIG. 3

SINGLE WAFER PROCESSING METHOD AND SYSTEM FOR PROCESSING SEMICONDUCTOR

BACKGROUND OF THE INVENTION

1. Technical Field

The present invention relates to a single-substrate processing method and apparatus for performing a semiconductor process, such as film-formation, etching, oxidation, diffusion, or annealing. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Background Art

In the process of manufacturing semiconductor devices, various semiconductor processing apparatuses are used for performing processes, such as film-formation, etching, oxidation, diffusion, and annealing, on a target substrate, such as a semiconductor wafer. A single-substrate processing apparatus for processing wafers one by one is known as a semiconductor processing apparatus of this kind.

FIG. 6 is a schematic structural view showing a conventional single-substrate processing apparatus for a semiconductor process. As shown in FIG. 6, this apparatus includes a process chamber 2, which can be vacuum-exhausted. A worktable 4 is disposed within the process chamber 2, for placing a semiconductor wafer W thereon. A showerhead 6 is disposed on the ceiling of the process chamber 2, for supplying a process gas. An exhaust line 7 is connected to the bottom of the process chamber 2, for exhausting the interior of the process chamber 2. A plurality of heating lamps (heater) 8 are disposed below the bottom of the process chamber 2, as a temperature control.

Thermic rays emitted from the heating lamps 8 are transmitted through a transmission window 9 formed of, e.g., quartz, and disposed in the bottom, and then the rays are radiated on the worktable 4. With the energy of the thermic rays, the wafer W is heated to a high temperature to perform a process at a predetermined temperature. The worktable 4 is provided with a temperature measuring device, such as a thermocouple 10. The temperature measured by the thermocouple 10 is transmitted to a temperature control section 11. The temperature control section 11 controls applied power to the heating lamps 8, on the basis of temperature measured by the thermocouple 10. As a consequence, the worktable 4 can be continuously maintained at a predetermined temperature.

The apparatus shown in FIG. 6 heats the worktable 4, thereby indirectly heating a wafer W placed thereon. Since there is a small thermal resistance between the wafer W and worktable 4, a temperature difference inevitably exists between the two members. Accordingly, the temperature of the worktable 4 is controlled in consideration of the temperature difference to heat the wafer W to a predetermined temperature.

SUMMARY OF THE INVENTION

The present inventors have found a problem in that the apparatus shown in FIG. 6 lowers its process repeatability with increase in the number of processed wafers W. An object of the present invention is to provide a single-substrate processing method and apparatus for a semiconductor process that can improve the process repeatability.

According to a first aspect of the present invention, there is provided a single-substrate processing method for a semiconductor process, comprising:

performing a plurality of process operations for subjecting a plurality of target substrates respectively to a semiconductor process in a process chamber, while temperature-controlling each target substrate through a temperature control medium that is temperature-controlled by a temperature control member, during the semiconductor process;

measuring a parameter representing a reflection coefficient within the process chamber, between first and last ones of the plurality of process operations, the reflection coefficient being changed depending on deposition of a by-product, which is generated during the semiconductor process, within the process chamber; and adjusting set temperature of the temperature control medium used in the semiconductor process, based on a measured value of the parameter, during process operations performed after measuring the parameter, wherein if the measured value of the parameter shows a decrease in the reflection coefficient, the set temperature of the temperature control medium is adjusted higher, while if the measured value of the parameter shows an increase in the reflection coefficient, the set temperature of the temperature control medium is adjusted lower.

According to a second aspect of the present invention, there is provided a single-substrate processing apparatus for a semiconductor process, comprising:

a process chamber configured to accommodate a target substrate;

a temperature control medium configured to temperature-control the target substrate;

a temperature control member configured to temperature-control the temperature control medium;

a gas supply system configured to supply a process gas into the process chamber;

a gas exhaust system configured to vacuum-exhaust the process chamber; and a control section configured to control operation of the apparatus, wherein the control section executes performing a plurality of process operations for subjecting a plurality of target substrates respectively to a semiconductor process in the process chamber, while temperature-controlling each target substrate through the temperature control medium that is temperature-controlled by the temperature control member, during the semiconductor process, measuring a parameter representing a reflection coefficient within the process chamber, between first and last ones of the plurality of process operations, the reflection coefficient being changed depending on deposition of a by-product, which is generated during the semiconductor process, within the process chamber, and adjusting set temperature of the temperature control medium used in the semiconductor process, based on a measured value of the parameter, during process operations performed after measuring the parameter, wherein if the measured value of the parameter shows a decrease in the reflection coefficient, the set temperature of the temperature control medium is adjusted higher, while if the measured value of the parameter shows an increase in the reflection coefficient, the set temperature of the temperature control medium is adjusted lower.

BRIEF DESCRIPTION OF DRAWINGS

FIGS. 2A, 2B, and 2C are graphs respectively showing the relationships of worktable set temperature, heating lamp applied power, and film thickness (or wafer temperature), relative to the number of processed wafers, in a processing method according to an embodiment of the present invention;

FIG. 3 is a view for explaining a procedure for forming reference data in the case of forming a tantalum oxide film by a CVD process, in a method according to an embodiment of the present invention;

BEST MODE FOR CARRYING OUT THE INVENTION

Figure 6:
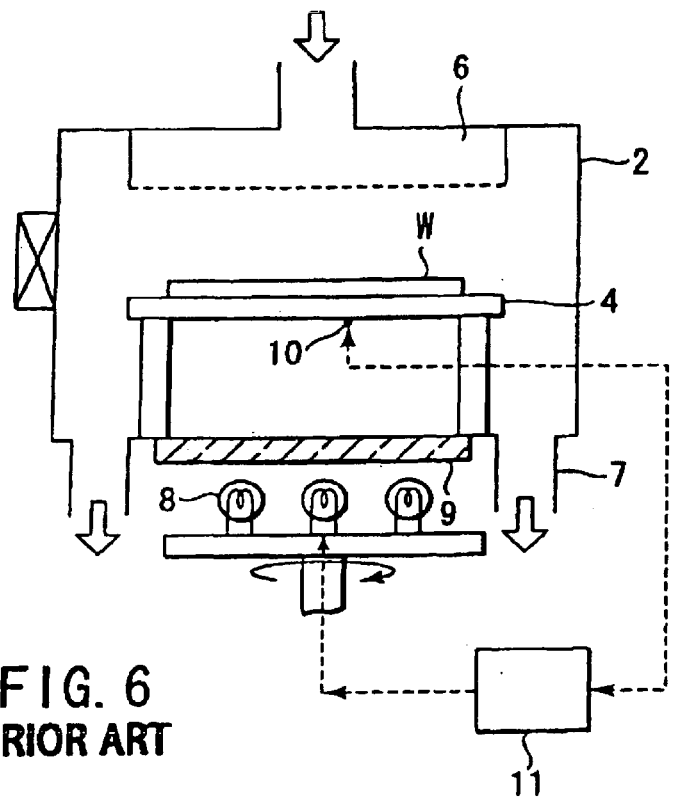
FIG. 6 is a schematic structural view showing a conventional single-substrate processing apparatus for a semiconductor process.

In the process of developing the present invention, the inventors studied the causes as to why the process repeatability of the single-substrate processing apparatus shown in FIG. 6 lowered with increase in the number of processed wafers W. As a result, the inventors have arrived at the findings given below.

During a process of a wafer W, traces of by-products generated in the process stick to the inner wall of the process chamber 2, the surface of the showerhead 6, and the like. Particularly, where the process is a film-formation process, such as CVD (Chemical Vapor Deposition), reaction by-products tend to deposit within the process chamber 2. The by-products accumulate and form a film in the course of process repetition. The by-product film thus formed effects a gradual change with time in the thermal environment within the process chamber 2, and more specifically the reflection coefficient. This change with time may increase or decrease in the reflection coefficient, depending on the type of depositing by-product film.

Change in the reflection coefficient of the inner wall of the process chamber 2 and particularly of the surface of the showerhead 6 brings about an ill effect on the process temperature of a wafer W. For example, even if the worktable 4 temperature is accurately kept constant, the wafer temperature changes with change in the reflection coefficient. As a consequence, the process (film thickness) repeatability lowers.

Figure 7A:
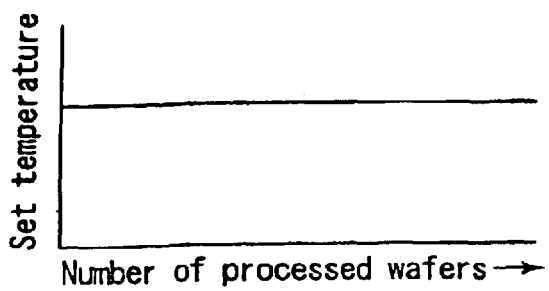
FIGS. 7A, 7B, and 7C are graphs respectively showing the relationships of worktable set temperature, heating lamp applied power, and film thickness (or wafer temperature), relative to the number of processed wafers.
Figure 7B:
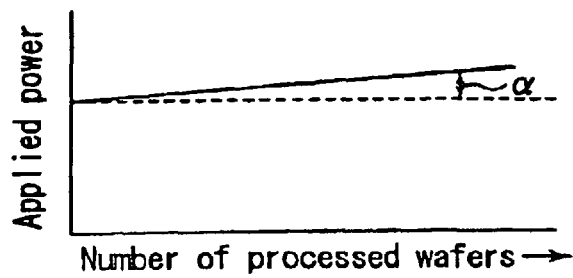
Figure 7C:
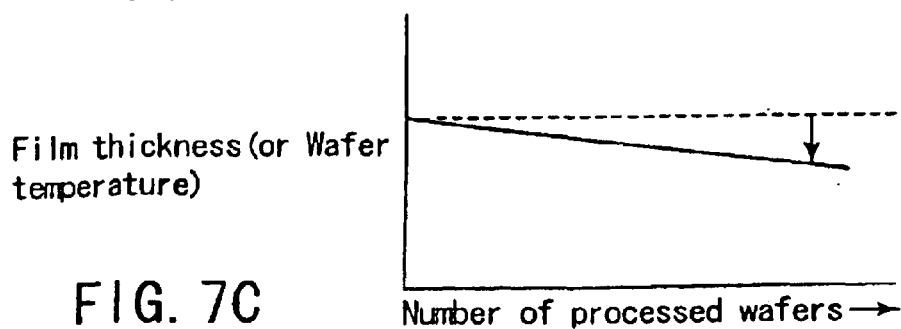

FIGS. 7A, 7B, and 7C are graphs respectively showing the relationships of worktable set temperature, heating lamp applied power, and film thickness (or wafer temperature), relative to the number of processed wafers. As shown in FIG. 7A, the worktable 4 is controlled to have a constant set temperature. Under such control, the reflection coefficient decreases with increase in the number of processed wafers, whereby the amount of heat radiation from each wafer W increases. Then, applied power (supplied power) to the heating lamps 8 tends to gradually, e.g., linearly with an inclination of about an angle α, increase to compensate for the increase in the amount of heat radiation, as shown in FIG. 7B.

However, in practice, increase in the amount of heat radiation from each wafer becomes larger than increase in the applied power. Accordingly, although the worktable 4 temperature is kept constant as shown in FIG. 7A, the actual wafer W temperature gradually decreases with increase in the number of processed wafers as shown in FIG. 7C. As a consequence, the thickness of films formed on the wafers W gradually decreases (the process repeatability lowers).

Figure 8:
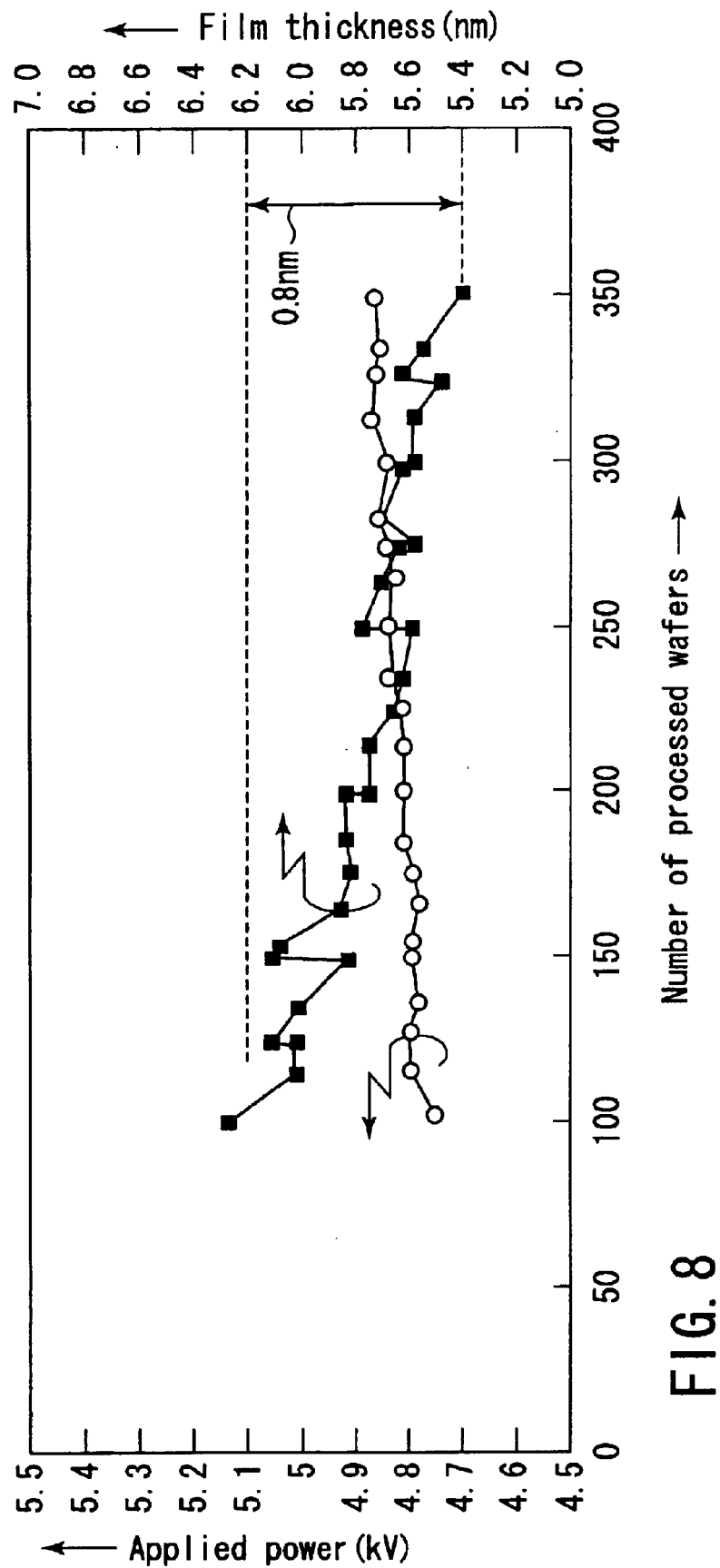
FIG. 8 is a graph showing the mean values of heating lamp applied power and film thickness, where a tantalum oxide film CVD process was performed on 350 semiconductor wafers in series, in accordance with a conventional technique.

FIG. 8 is a graph showing the mean values of heating lamp applied power and film thickness, where a tantalum oxide film CVD process was performed on 350 semiconductor wafers in series, in accordance with a conventional technique. In this case, the worktable temperature was kept constant at 480° C. As shown in FIG. 8, with increase in the number of processed wafers, the applied power gradually increases while the mean value of the film thickness gradually decreases. The decrease in the film thickness reaches a large value, such as about 0.8 nm (13 to 15%), which is an undesirable characteristic.

On the other hand, there is a case where a radiation thermometer or the like is used to directly measure wafer temperature, so that the wafer temperature is controlled on the basis of the measured value. However, by-products stick also to the surface of a transmission window used for measurement by the radiation thermometer, with increase in the number of processed wafers. Then, a problem arises in that measurement of the wafer temperature becomes inaccurate due to disturbance by the by-products.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
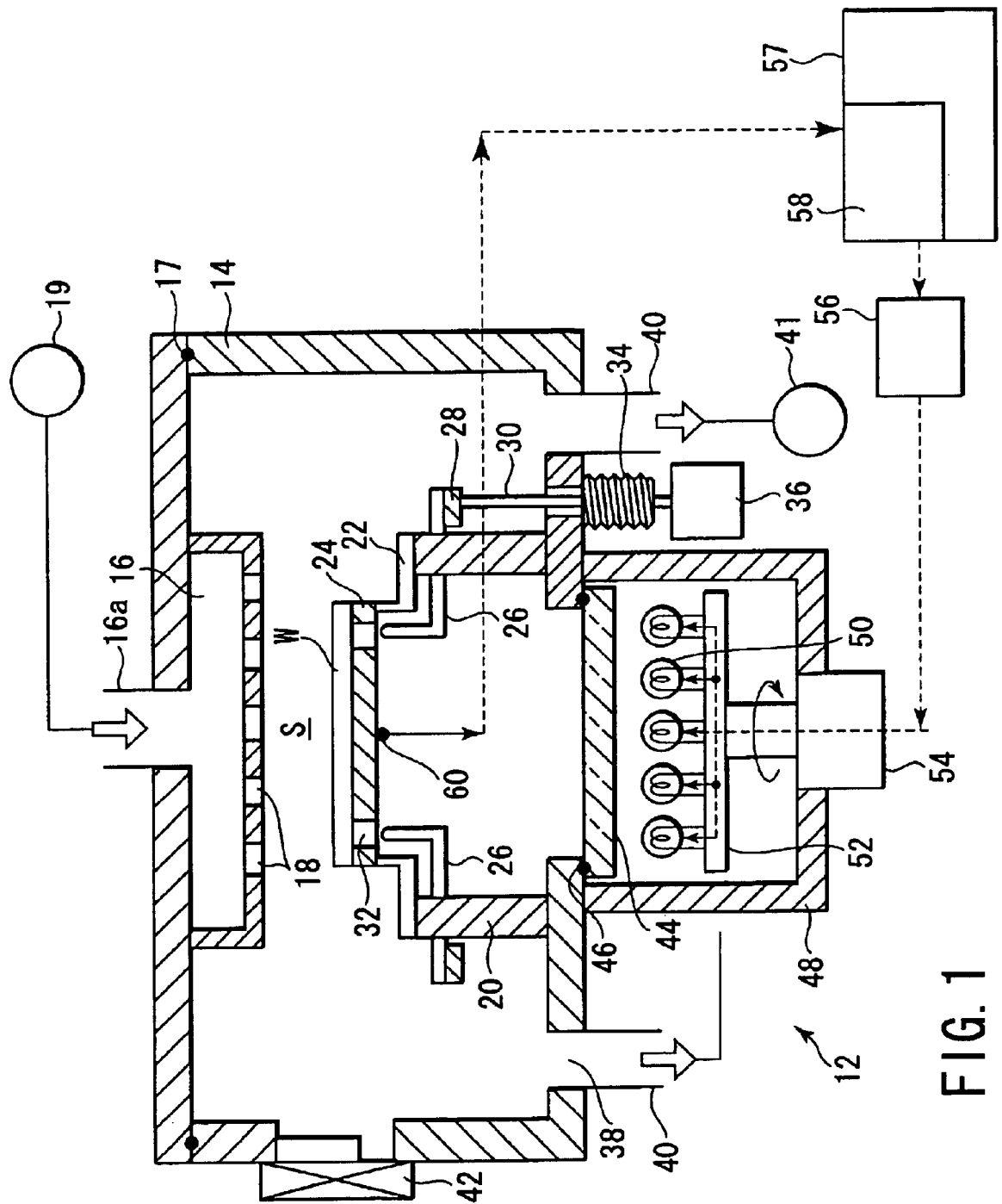
FIG. 1 is a schematic structural view showing a CVD apparatus as a single-substrate processing apparatus for a semiconductor process according to an embodiment of the present invention.

FIG. 1 is a schematic structural view showing a CVD apparatus as a single-substrate processing apparatus for a semiconductor process according to an embodiment of the present invention. As shown in FIG. 1, the CVD apparatus 12 has a process chamber 14, e.g., made of aluminum and having an almost cylindrical sectional shape, for accommodating a semiconductor wafer W as a target substrate. A sidewall of the process chamber 14 is provided with a gate valve 42, which is opened and closed in accordance with loading/unloading of the wafer.

A showerhead 16 is disposed on the ceiling in the process chamber 14 through a seal member 17, such as an O-ring, and supplies a process gas at a controlled flow rate. The showerhead 16 is connected to a process gas source 19 through a gas supply line 16a. The bottom face of the showerhead 16 is provided with a number of gas spouting holes 18, through which the process gas is delivered toward the process space S.

A worktable 24 is disposed in the process chamber 14, for placing the wafer W thereon. The worktable 24 functions as a temperature control medium for controlling the temperature of the wafer W. The worktable 24 is supported by a cylindrical reflector 20 standing on the process chamber bottom, and through, e.g., three L-shaped holding members 22 (only two of them are shown in FIG. 1). The reflector 20 is made of aluminum. The holding members 22 are made of a material that transmits thermic rays, such as quartz. The worktable 24 has a thickness of about 1 mm and is made of a material, such as a carbon based material, or a ceramic, e.g., AlN.

A plurality of, e.g., three, vertical lifter pins 26 (only two of them are shown in FIG. 1) made of, e.g., quartz, are provided below the worktable 24. The lifter pins 26 can project upward from lifter holes 32 formed in the worktable 24 to support the wafer W. The lifter pins 26 are connected to one another at the bottoms by a ring 28 made of, e.g., quartz, so that they move up and down together. The ring 28 is connected to the top of a pusher rod 30, which vertically extends through the process chamber bottom. When assisting loading and unloading of the wafer W relative to the worktable 24, the pusher rod 30 moves up and down to move the lifter pins 26 up and down relative to the worktable 24.

The bottom of the pusher rod 30 is connected by a flange (not shown) to an actuator 36 for reciprocating the rod relative to the process chamber 14. The actuator 36 is fixed to the process chamber bottom by an attachment (not shown). That portion of the process chamber bottom where the pusher rod 30 penetrates therethrough is provided with a bellows 34 that is extensible/contractible. The bellows 34 connects the bottom flange (not shown) of the pusher rod 30 to the process chamber 14, and forms an airtight space that communicates with the process chamber 14. The bellows 34 allows the pusher rod 30 to move up and down while the process chamber 14 remains airtight.

Exhaust ports 38 are formed in the bottom periphery of the process chamber 14. The exhaust ports 38 are connected to an exhaust, such as a vacuum pump 41, through exhaust lines 40. The exhaust can vacuum-exhaust the interior of the process chamber 14 to set it at a predetermined vacuum level.

A transmission window 44 made of a material that transmits thermic rays, such as quarts, is airtighly attached through a seal member 46, such as an O-ring, to the process chamber bottom at a position directly below the worktable 24. A box-like heating chamber 48 is disposed below the transmission window 44 and surrounds the transmission window 44. A temperature control, such a plurality of heating lamps (heater) 50, is disposed in the heating chamber 48. The heating lamps 50 are attached to a rotary table 52, which also functions as a reflecting mirror. The rotary table 52 is rotated through a rotary shaft by a rotary motor 54 disposed at the bottom of the heating chamber 48. Thermic rays emitted from the heating lamps 50 are transmitted through the transmission window 44 and radiated on the bottom of the worktable 24, thereby heating the worktable 24 and further heating the wafer W on the worktable 24 indirectly. supply 56 for supplying power to them. The power supply 56 is controlled by a temperature control section 58 arranged in a CPU 57 formed of, e.g., a microcomputer. The temperature control section 58 performs a control operation to change the set temperature of the worktable 24, in accordance with change with time in the reflection coefficient within the process chamber, which is caused with increase in the number of processed wafers W.

On the other hand, a temperature measuring device, such as a plurality of thermocouples 60 (only one of them shown in FIG. 1 for the sake of understanding), is disposed on the bottom of the worktable 24, for measuring the temperature thereof. The measured values obtained by the thermocouples 60 are sent to the temperature control section 58. The thermocouples 60 are respectively disposed in, e.g., coaxial zones, so that the heating lamps 50 are controllable for each zone.

Next, an explanation will be given of a processing method in the CVD apparatus 12 shown in FIG. 1. The processing method described below is performed under the control of the CPU 57.

The gate valve 42 disposed on a sidewall of the process chamber 14 is first opened, and a wafer W is transferred into the process chamber 14 by a transfer arm (not shown). Then, the lifter pins 26 are moved up to receive the wafer W by the lifter pins 26. Then, the lifter pins 26 are moved down by the pusher rod 30 to place the wafer W on the worktable 24.

Then, the heating lamps 50 of the temperature control disposed below the worktable 24 are operated while they are rotated, to emit thermal energy. The thermic rays thus emitted are transmitted through the transmission window 44 and radiated on the bottom of the worktable 24, thereby heating it. Since the worktable 24 is very thin, such as about 1 mm, as described above, it is rapidly heated and thus the wafer W placed thereon is also rapidly heated to a predetermined temperature.

On the other hand, a predetermined film-formation gas, i.e., a process gas, is supplied from the process gas source 19 to the showerhead 16, and then supplied through the gas spouting holes 18 into the process chamber 14 almost uniformly. At the same time, the interior of the process chamber 14 is vacuum-exhausted by the vacuum pump 41 through the exhaust ports 38, and set at a predetermined vacuum level, such as about 600 Pa. The film-formation gas thus supplied causes a predetermined chemical reaction by the agency of thermal energy from the heating lamps 50 and provides a film-formation material, which is then deposited on the wafer.

During the CVD process on the wafer W, since the temperature of the wafer W cannot be directly measured, it is measured by the thermocouples 60. The measured values obtained by the thermocouples 60 are fed back to the temperature control section 58 in the CPU 57. The temperature control section 58 controls the applied powers to the heating lamps 50, so that the measured values thus fed back agree with the set temperature of the worktable 24.

With increase in the number of processed wafers, by-products deposit on the inner wall of the process chamber 14, the surface (bottom) of the showerhead 16, and the like, thereby bringing about a change over time in the reflection coefficient. The change in the reflection coefficient depends on the type of depositing by-products, and thus it may increase or decrease from the initial state in the process chamber 14 (e.g. immediately after cleaning). In the following description, an explanation will be exemplified by a case where the reflection coefficient decreases with time.

As described above, according to the conventional film-formation method, the set temperature of the worktable is kept constant without reference to the number of processed wafers (see FIG. 7A). When the reflection coefficient within the process chamber decreases, the heat radiation amount from the worktable and wafer increases, and thus the applied power (supplied power) to the heating lamps increases to compensate for this (see FIG. 7B). However, since increase in the heat radiation amount from the wafer cannot be sufficiently compensated for, the wafer temperature (or film thickness) gradually lowers (see FIG. 7C).

FIGS. 2A, 2B, and 2C are graphs respectively showing the relationships of worktable set temperature, heating lamp applied power, and film thickness (or wafer temperature), relative to the number of processed wafers, in a processing method according to an embodiment of the present invention. As shown in FIG. 2A, the set temperature of the worktable 4 is controlled to gradually increase with increase in the number of processed wafers. Specifically, the set temperature is increased stepwise every time a predetermined number of wafers, e.g., 25 wafers, have been processed. The set temperature may be gradually increased continuously and linearly every time one wafer has been processed. Furthermore, the set temperature may be increased while one wafer is being processed.

As described above, when the set temperature of the worktable 4 gradually increases, the applied power to the heating lamps 50 also gradually increases in accordance with this, as shown in FIG. 2B. At this time, the inclination angle β denoting increase in the applied power is larger than the inclination angle α shown in FIG. 7B. The increase in the applied power is controlled to compensate for change with time in the reflection coefficient within the process chamber 14, so as to keep the wafer temperature essentially constant, as shown in FIG. 2C. As a consequence, the thickness of films formed on wafers W become almost uniform, thereby improving the process repeatability.

In this embodiment, the set temperature of the worktable 24 is adjusted by the temperature control section 58 in the CPU 57, in accordance with the following sequence.

First, reference data that shows the relationship between change in the applied power and change in the wafer W temperature is formed in the case of processing a plurality of wafers while maintaining the temperature control medium or worktable 24 at a constant reference temperature (for example, the initial set temperature). For example, this data results in those shown in FIGS. 7A, 7B, and 7C. In this reference data, the applied power to the heating lamps 50 works as a parameter representing the reflection coefficient within the process chamber 14.

Then, in performing the process for products, applied power necessary for causing the temperature of the worktable 24, with a wafer W placed thereon, to be the reference temperature (for example, the initial set temperature) is measured, after the process on a certain number of wafers W is finished. Then, comparing the measured value of the applied power with the reference data can provide a unit of information on the level of decrease in the reflection coefficient, in a manner represented by the difference between the worktable 24 temperature and wafer W temperature. On the basis of this, a correction value is calculated in the set temperature of the worktable 24, necessary for maintaining the wafer W at a predetermined process temperature in the process performed after the measurement, and then the set temperature of the worktable 24 is adjusted. Where the measured value of the applied power suggests a decrease in the reflection coefficient, the set temperature of the worktable 24 is adjusted higher. Where the measured value of the applied power suggests an increase in the reflection coefficient, the set temperature of the worktable 24 is adjusted lower.

Several time points may be prepared for measuring the applied power (parameter) between a plurality of process operations (each operation of processing each wafer). As a temperature adjusting method, the set temperature of the worktable 24 for the process operations performed between two measuring time points is adjusted to be the same temperature determined on the basis of a measured value obtained at the immediately preceding measuring time point. As another temperature adjusting method, the set temperature of the worktable 24 for the process operations performed between two measuring time points is adjusted in accordance with an interpolation line determined on the basis of measured values obtained at the immediately preceding two measuring time points.

For example, where a CVD process is performed as a semiconductor process on wafers, a process is performed under the same conditions as the actual CVD process, to form a reference data. In this stage, determination is made on the initial set temperature (reference temperature) of the worktable 24 to be used for the CVD process performed immediately after cleaning of the interior of the process chamber 14. Then, a temperature variable ratio to be accompanied with this initial set temperature is obtained. The temperature variable ratio is a ratio of change in the temperature difference between the worktable 24 temperature and the wafer W actual temperature, relative to change in the applied power to the heating lamps 50, resulting from increase in the number of processed wafers. Then, a relational expression as shown in the following formula 1 for calculating the set temperature Ts is formed and stored in the temperature control section 58.

$$Ts = To + A \cdot \Delta P \quad (1)$$

In this formula, To is the initial set temperature, A is the temperature variable ratio, and ΔP is the power variable ratio of the applied power given to the heating lamps (heater) relative to the reference power.

Then, in performing the process for products, every time a predetermined number of wafers, e.g., 25 wafers, have been processed, e.g., a dummy wafer is used to measure the amount of change with time in the reflection coefficient. The temperature control section 58 performs control to adjust the set temperature of the worktable 24 in accordance with the amount of change with time in the reflection coefficient thus obtained. It may be possible to use no dummy wafer, but to monitor change with time (power change) while setting an initial temperature during a temperature recovery time before deposition on an ordinary product wafer. In this case, the deposition is started after the worktable set temperature is adjusted and the wafer temperature stabilizes. This method can obviate the time and cost associated with using a dummy wafer.

FIG. 3 is a view for explaining a procedure for forming reference data in the case of forming a tantalum oxide film by a CVD process. In FIG. 3, the left half shows an initial state, i.e., a state immediately after assembling of the apparatus, or a state immediately after cleaning within the process chamber 14. The right half shows a state after the CVD process is performed on a certain number of wafers. In the right half, a tantalum oxide film or by-product film 62 is deposited on the surface of the showerhead 16. In this case, the reflection coefficient of, e.g., the bottom of the showerhead 16 has decreased from the initial state.

First, in the initial state, the process is performed while the initial set temperature To of the worktable 24 is set at, e.g., 480° C., and, at this time, the wafer W actual temperature is measured by, e.g., a radiation thermometer. For example, it is assumed that the wafer W temperature is 450° C. and thus has a temperature difference of 30° C. relative to the worktable 24, while the applied power (reference power) to the heating lamps 50 takes on 50%.

Then, the CVD process is performed on a plurality of wafers W, whereby the by-product film 62 is deposited on the bottom of the showerhead 16 and so forth. In this state, the temperature of the worktable 24 on which a new wafer W is placed is set at the initial set temperature To, i.e., 480° C. Since the reflection coefficient of the bottom of the showerhead 16 and so forth has decreased, the heat radiation amount form the wafer W has increased that much. As a consequence, although the worktable 24 temperature is maintained at 480° C., the wafer W actual temperature becomes 447° C., which is 3° C. lower than the initial state. The radiation thermometer is used to measure the wafer W temperature. At this time, the applied power to the heating lamps 50 slightly increases by, e.g., 2%, and takes on 52%, to compensate for the decrease in the wafer W temperature, although it is not sufficient.

According to the result described above, the set temperature Ts in the formula 1 is expressed by the following formula 2, for film-formation of the tantalum oxide film.

$$Ts=480° C.+1.5 \cdot \Delta P \qquad (2)$$

Specifically, as described above, the temperature variable ratio A is defined by a ratio of change in the temperature difference between the worktable 24 temperature, such as 480° C., and the wafer W actual temperature, relative to change in the applied power to the heating lamps 50. The change in the temperature difference describe above is expressed by (480° C.−447° C.)−(480° C.−450° C.)=3° C. The change in the applied power to the heating lamps 50 is expressed by 52%−50%=2%. Then, the ratio A between them is expressed by 3° C./2%=1.5.

As described above, the formula 2 for calculating the set temperature Ts is determined for film-formation of the tantalum oxide film. The formula 2, reference temperature, reference power (applied power in the initial state), and so forth are stored in the temperature control section 58 in the CPU 57 formed of, e.g., a micro-computer.

Then, in performing the CVD process of the tantalum oxide film for products, every time a predetermined number of wafers, e.g., 25 wafers, have been processed, e.g., a dummy wafer is used to measure the amount of change with time in the reflection coefficient. For this, the CVD process is performed while the worktable 24 is set at the initial set temperature (480° C.), and, at this time, the amount of change in the reflection coefficient is measured. This amount of change corresponds to the amount of change in the applied power to the heating lamps 50. The temperature control section 58 calculates a power variable ratio ΔP of the applied power relative to the reference power at this time, and substitutes the ratio into the formula 2 to obtain a new set temperature Ts.

For example, where the applied power takes on 50.27% and thus the power variable ratio ΔP of the applied power is 0.27 (=50.27−50), the set temperature Ts becomes 480.4° C. (=480° C.+1.5×0.27). Then, in the serial process on the following 25 wafers, the worktable 24 temperature is controlled on the basis of this new set temperature Ts (=480.4° C.).

Thereafter, an operation to change the set temperature Ts is repeated in the same manner every time, e.g., 25 wafers have been processed.

Figure 4:
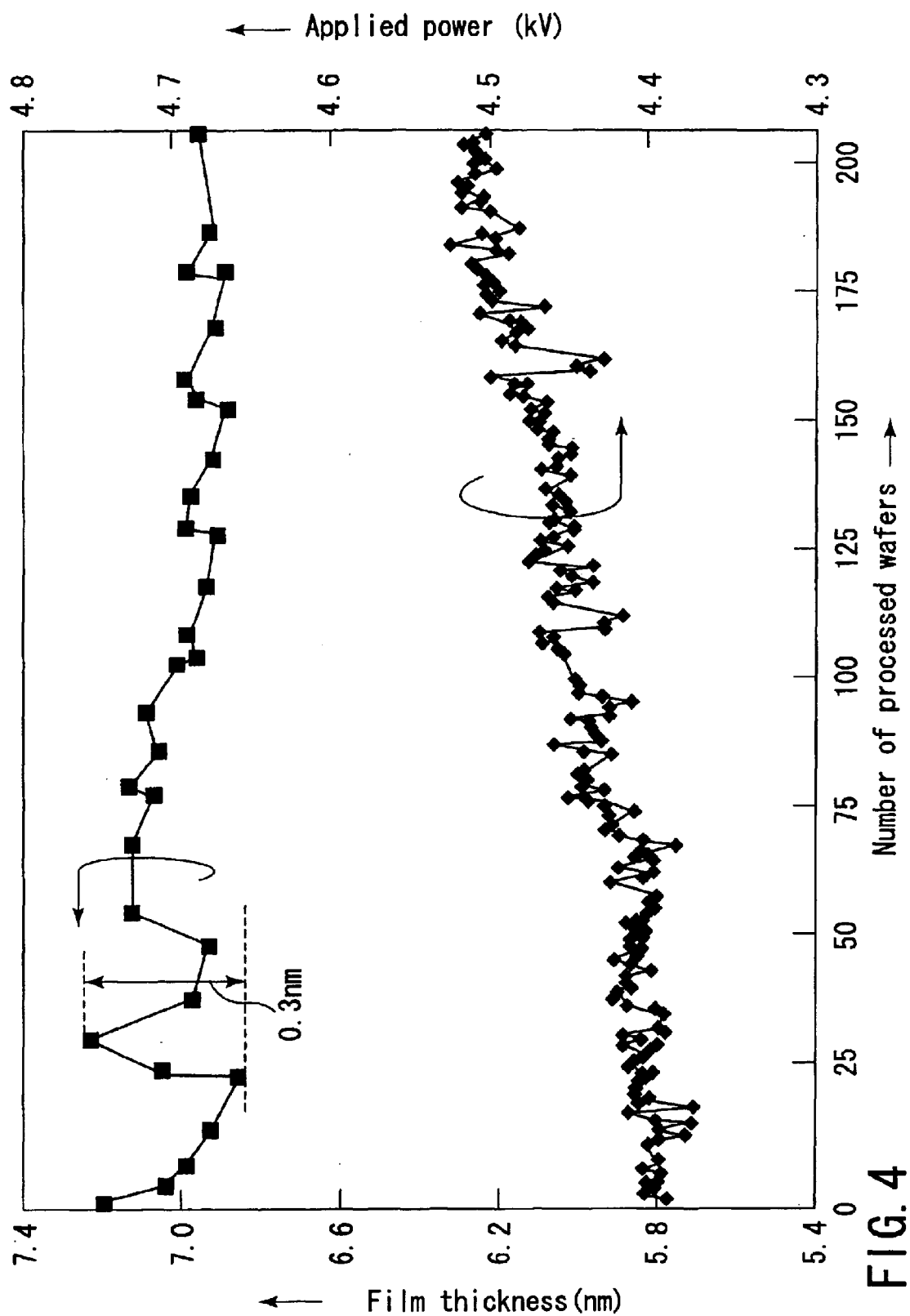
FIG. 4 is a graph showing the mean values of heating lamp applied power and film thickness, where a tantalum oxide film CVD process was performed on 200 semiconductor wafers in series, in accordance with a method according to an embodiment of the present invention.
Figure 5:
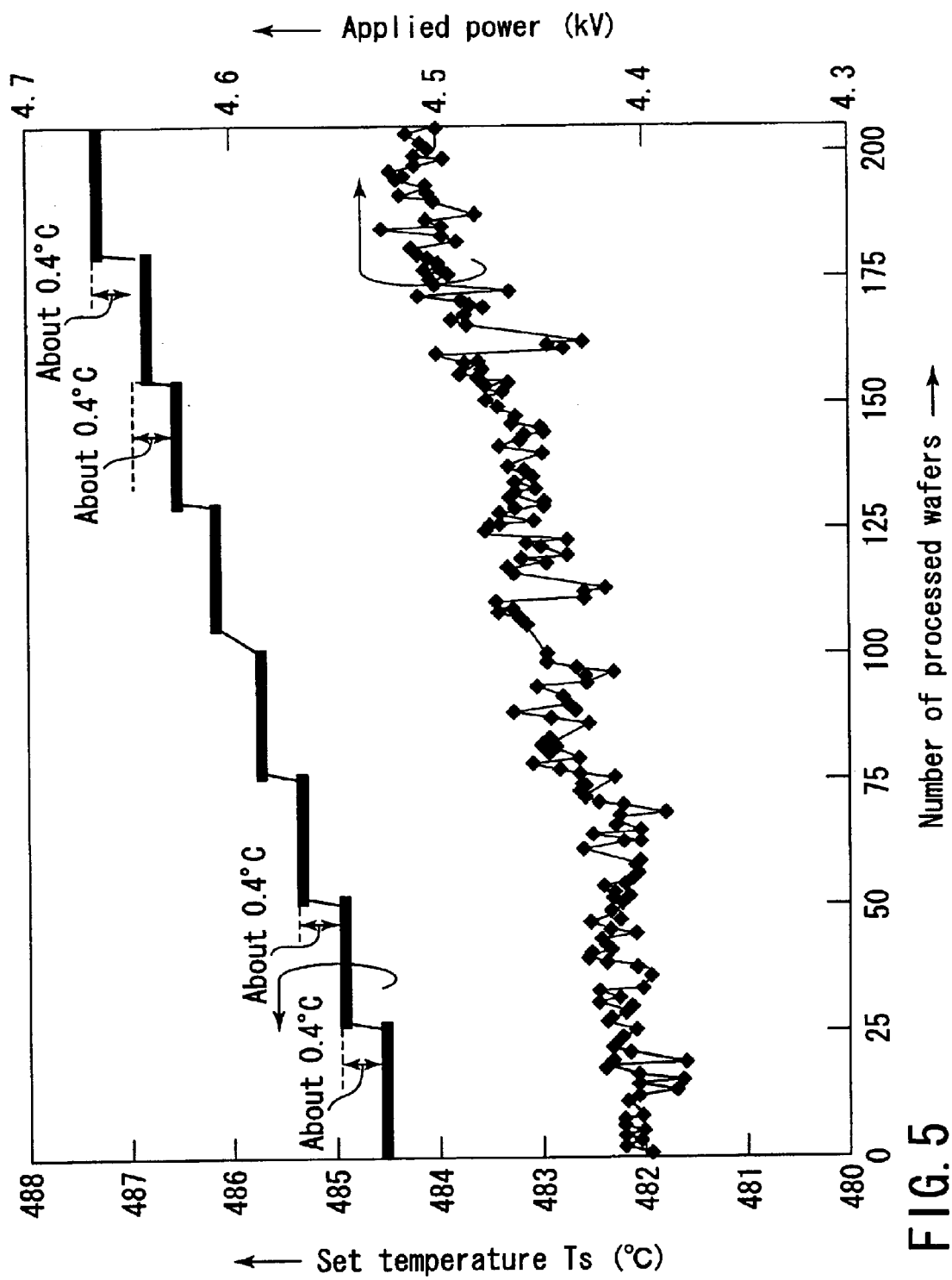
FIG. 5 is a graph showing the mean values of heating lamp applied power and worktable set temperature, where a tantalum oxide film CVD process was performed on 200 semiconductor wafers in series, in accordance with the method according to an embodiment of the present invention.

FIG. 4 is a graph showing the mean values of heating lamp applied power and film thickness, where a tantalum oxide film CVD process was performed on 200 semiconductor wafers in series, in accordance with a method according to an embodiment of the present invention. FIG. 5 is a graph showing the mean values of heating lamp applied power and worktable set temperature, where a tantalum oxide film CVD process was performed on 200 semiconductor wafers in series, in accordance with the method according to an embodiment of the present invention.

As shown in FIG. 5, in this case, a measuring operation using a dummy wafer was performed as described above, every time 25 semiconductor wafers had been processed. Then, the set temperature Ts of the worktable 24 was controlled by setting the initial set temperature at 480° C., and increasing it by about 0.4° C. (by increasing the applied power), every time 25 wafers had been processed. As a consequence, the variable rate of the tantalum oxide film thickness was very small, such as about ±2.14%. On the other hand, in the conventional method shown in FIG. 8, the variable rate was about ±6.9%. Accordingly, it has been confirmed that the method according to this embodiment of the present invention remarkably improves the CVD process repeatability.

It should be noted that, in general, the interior of the process chamber 14 is subjected to a cleaning process periodically or non-periodically to remove unnecessary films sticking to the inside. The interior of the process chamber returns to the initial state immediately after this cleaning.

In the embodiment described above, the set temperature Ts of the worktable 24 is changed, every time 25 wafers have been processed. Alternatively, the set temperature Ts of the worktable 24 may be changed, every time one or several wafers, e.g., 5 wafers, have been processed. In the embodiment described above, the set temperature Ts is maintained the same while 25 wafers are processed. Alternatively, the set temperature Ts of the worktable 24 may be gradually changed, every time one or several wafers have been processed while 25 wafers are processed. In this case, an interpolation line may be formed on the basis of the last measurement result, i.e., a set temperature Ts-1, and the last-but-one measurement result, i.e., a set temperature Ts-2, to adjust the set temperature Ts.

In the formula 1, the initial set temperature To and the temperature variable ratio A vary depending on the type of by-product film. Change in the reflection coefficient within a process chamber may be a gradual decrease or gradual increase, depending on the type of depositing by-product film. Examples of decreasing the reflection coefficient are a tantalum oxide film, silicon film, poly-crystalline silicon film, and $SiO_2$ film. Examples of increasing the reflection coefficient are metal films, such as a tungsten film, aluminum film, titanium film, and copper film.

In the embodiment described above, the applied power to the heating lamps 50 is used as a parameter representing the reflection coefficient within the process chamber 14. However, another parameter, such as light quantity from a specific portion within the process chamber 14, or the temperature of a specific portion within the process chamber 14, may be used as a parameter representing the reflection coefficient within the process chamber 14.

In the embodiment described above, the heating lamps 50 are used as a temperature control. Alternatively, a resistance-heating heater embedded in a worktable may be used as the temperature control. A cooler may be used solely or along with a heater, as the temperature control. Other than a CVD apparatus shown as an example in the embodiment described above, the present invention may be applied to a semiconductor processing apparatus, such as an etching apparatus, sputtering apparatus, oxidation or diffusion apparatus, or apparatus. Further more, the present invention may be applied to a target substrate other than a semiconductor wafer, such as an LCD substrate or glass substrate.

The present invention is not limited to the embodiments described above, but can be practiced in various manners without departing from the spirit and scope of the invention. The features of the embodiments described above can be arbitrarily combined with each other in practice, thereby obtaining combined effects.

What is claimed is:

1. A single-substrate processing method for a semiconductor process, comprising:
   performing a plurality of process operations for subjecting a plurality of target substrates respectively to a semiconductor process in a process chamber, while temperature-controlling each target substrate through a temperature control medium that is temperature-controlled by a temperature control member, during the semiconductor process;
   measuring a parameter representing a reflection coefficient within the process chamber, between first and last ones of the plurality of process operations, the reflection coefficient being changed depending on deposition of a by-product, which is generated during the semiconductor process, within the process chamber; and
   adjusting set temperature of the temperature control medium used in the semiconductor process, based on a measured value of the parameter, during process operations performed after measuring the parameter, wherein if the measured value of the parameter shows a decrease in the reflection coefficient, the set temperature of the temperature control medium is adjusted higher, while if the measured value of the parameter shows an increase in the reflection coefficient, the set temperature of the temperature control medium is adjusted lower.

2. The method according to claim 1, further comprising forming reference data that represents a relationship between change in the reflection coefficient and change in the parameter, wherein adjusting the set temperature of the temperature control medium is performed with reference to the reference data.

3. The method according to claim 1, wherein the temperature control member comprises a heater electrically generating heat, and the parameter is applied power to the heater necessary for heating the temperature control medium to a constant reference temperature.

4. The method according to claim 3, further comprising forming reference data that represents a relationship between change in the applied power and change in temperature of a plurality of reference target substrates, when processing the reference target substrates while maintaining the temperature control medium at the constant reference temperature, wherein adjusting the set temperature of the temperature control medium is performed with reference to the reference data.

5. The method according to claim 1, wherein a plurality of measuring time points of the parameter are prepared between the plurality of process operations, and the set temperature of the temperature control medium used in the semiconductor process, during process operations performed between two measuring time points, is adjusted to be the same temperature determined based on a measured value obtained at an immediately preceding measuring time point.

6. The method according to claim 1, wherein a plurality of measuring time points of the parameter are prepared between the plurality of process operations, and the set temperature of the temperature control medium used in the semiconductor process, during process operations performed between two measuring time points, is adjusted in accordance with an interpolation line determined based on measured values obtained at immediately preceding two measuring time points.

7. The method according to claim 1, wherein the temperature control medium is a worktable configured to place the target substrates thereon one by one.

8. The method according to claim 1, wherein the semiconductor process is a process of depositing a film on each target substrate.

9. A single-substrate processing apparatus for a semiconductor process, comprising:
   a process chamber configured to accommodate a target substrate;
   a temperature control medium configured to temperature-control the target substrate;
   a temperature control member configured to temperature-control the temperature control medium;
   a gas supply system configured to supply a process gas into the process chamber;
   a gas exhaust system configured to vacuum-exhaust the process chamber; and
   a control section configured to control operation of the apparatus,
   wherein the control section executes
   performing a plurality of process operations for subjecting a plurality of target substrates respectively to a semiconductor process in the process chamber, while temperature-controlling each target substrate through the temperature control medium that is temperature-controlled by the temperature control member, during the semiconductor process,
   measuring a parameter representing a reflection coefficient within the process chamber, between first and last ones of the plurality of process operations, the reflection coefficient being changed depending on deposition of a by-product, which is generated during the semiconductor process, within the process chamber, and
   adjusting set temperature of the temperature control medium used in the semiconductor process, based on a measured value of the parameter, during process operations performed after measuring the parameter, wherein if the measured value of the parameter shows a decrease in the reflection coefficient, the set temperature of the temperature control medium is adjusted higher, while if the measured value of the parameter shows an increase in the reflection coefficient, the set temperature of the temperature control medium is adjusted lower.

10. The apparatus according to claim 9, wherein the control section adjusts the set temperature of the temperature control medium with reference to reference data that represents a relationship between change in the reflection coefficient and change in the parameter.

11. The apparatus according to claim 9, wherein the temperature control member comprises a heater electrically generating heat, and the parameter is applied power to the heater necessary for heating the temperature control medium to a constant reference temperature.

12. The apparatus according to claim 11, wherein the control section adjusts the set temperature of the temperature control medium with reference to reference data that represents a relationship between change in the applied power and change in temperature of a plurality of reference target substrates, when processing the reference target substrates while maintaining the temperature control medium at the constant reference temperature.

13. The apparatus according to claim 9, wherein the control section is arranged such that a plurality of measuring time points of the parameter are prepared between the plurality of process operations, and the set temperature of the temperature control medium used in the semiconductor process, during process operations performed between two measuring time points, is adjusted to be the same temperature determined based on a measured value obtained at an immediately preceding measuring time point.

14. The apparatus according to claim 9, wherein the control section is arranged such that a plurality of measuring time points of the parameter are prepared between the plurality of process operations, and the set temperature of the temperature control medium used in the semiconductor process, during process operations performed between two measuring time points, is adjusted in accordance with an interpolation line determined based on measured values obtained at immediately preceding two measuring time points.

15. The apparatus according to claim 9, wherein the temperature control medium is a worktable configured to place the target substrates thereon one by one.

16. The apparatus according to claim 9, wherein the semiconductor process is a process of depositing a film on each target substrate.

* * * * *